US012595166B2

(12) United States Patent
Timme et al.

(10) Patent No.: US 12,595,166 B2
(45) Date of Patent: Apr. 7, 2026

(54) MEMS DEVICE

(71) Applicant: Infineon Technologies AG, Neubiberg (DE)

(72) Inventors: Hans-Jörg Timme, Ottobrunn (DE); Stefan Barzen, Munich (DE); Marc Füldner, Neubiberg (DE); Stefan Geißler, Regensburg (DE); Matthias Friedrich Herrmann, Munich (DE); Maria Kiriak, Munich (DE); Abidin Güçlü Onaran, Munich (DE); Konstantin Tkachuk, Unterhaching (DE); Arnaud Walther, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 321 days.

(21) Appl. No.: 18/305,905

(22) Filed: Apr. 24, 2023

(65) Prior Publication Data

US 2023/0339743 A1      Oct. 26, 2023

(30) Foreign Application Priority Data

Apr. 25, 2022   (EP) ..................................... 22169837

(51) Int. Cl.
B81B 3/00            (2006.01)

(52) U.S. Cl.
CPC .... B81B 3/0021 (2013.01); B81B 2201/0257 (2013.01); B81B 2203/0127 (2013.01);
(Continued)

(58) Field of Classification Search
CPC .......... B81B 3/0021; B81B 2201/0257; B81B 2203/0127; B81B 2203/0307;
(Continued)

(56) References Cited

U.S. PATENT DOCUMENTS 9,438,979 B2 * 9/2016 Dehe ...................... H04R 19/04
10,433,070 B2 * 10/2019 Dehe ................... B81C 1/00166
(Continued)

FOREIGN PATENT DOCUMENTS

CN             111818434 A        10/2020
WO      WO-2020062144 A1 *   4/2020   ............. H04R 19/04

*Primary Examiner* — Angelica M McKinney
(74) *Attorney, Agent, or Firm* — Slater Matsil, LLP

(57)            ABSTRACT

A MEMS device includes a first deflectable membrane structure, a rigid electrode structure and a second deflectable membrane structure in a vertically spaced configuration. The rigid electrode structure is arranged between the first and second deflectable membrane structures. The first and second deflectable membrane structures each includes a deflectable portion, and the deflectable portions of the first and second deflectable membrane structures are mechanically coupled by mechanical connection elements to each other and are mechanically decoupled from the rigid electrode structure. At least a subset of the mechanical connection elements are elongated mechanical connection elements. The elongated mechanical connection elements have a lateral cross-sectional area with a laterally elongated dimension along a direction which is within a tolerance range of +/−20° perpendicular to the local membrane deflection gradient of the first and second deflectable membrane structures at the lateral position of the respective elongated mechanical connection element.

19 Claims, 8 Drawing Sheets

(52) U.S. Cl.
　　CPC ................. *B81B 2203/0307* (2013.01); *B81B*
　　　　　　　　*2203/0353* (2013.01); *B81B 2203/0361*
　　　　　　　　(2013.01); *B81B 2203/04* (2013.01)
(58) Field of Classification Search
　　CPC .... B81B 2203/0353; B81B 2203/0361; B81B
　　　　　　　2203/04; B81B 7/02; H04R 19/02; H04R
　　　　　　　19/04; H04R 2201/003; H04R 2400/01;
　　　　　　　　　　　　　　　　　　H04R 7/08
　　See application file for complete search history.

(56) References Cited

U.S. PATENT DOCUMENTS

| | | | |
|---|---|---|---|
| 2015/0001647 A1* | 1/2015 | Dehe .................... | B81B 3/0078 |
| | | | 257/416 |
| 2018/0170745 A1 | 6/2018 | Barzen et al. | |
| 2019/0023562 A1 | 1/2019 | Fueldner et al. | |
| 2019/0071305 A1* | 3/2019 | Strasser ................... | B81B 7/02 |
| 2020/0204925 A1* | 6/2020 | Zou ......................... | H04R 7/02 |
| 2020/0216309 A1 | 7/2020 | Fueldner et al. | |

* cited by examiner (top view)

$x_1, x_2$ = local pillar coordinate sysem
through pillar area centroid $C_{109}$ $x_T \cong x_1$ (→tolerance range)

axis $x_T$ = tangent to contour line
through pillar area centroid $C_{109}$

MEMS DEVICE

This application claims the benefit of European Patent Application No. 22169837, filed on Apr. 25, 2022, which application is hereby incorporated herein by reference.

TECHNICAL FIELD

Embodiments according to the present application are generally directed to a MEMS device (MEMS=microelectromechanical system).

BACKGROUND

A microphone is an acoustic sensor converting an acoustic pressure wave to an electric signal. The MEMS microphone function as a variable capacitor having a fixed plate (electrode) and a movable plate (electrode). When an acoustic pressure wave is applied to the MEMS microphone, the membrane is able to move in response to the acoustic pressure wave. The movement of the membrane relative to the fixed (rigid) backplate varies the distance between the membrane and the backplate of the variable capacitor, which in turn varies the capacitances of the variable capacitor. The variation of the capacitance is determined by various parameters of the acoustic pressure wave, such as sound pressure levels of the acoustic pressure wave. The variation of the capacitance of the MEMS microphone is converted into an analog signal, which is usually fed into an ASIC for further processing.

On the field of MEMS microphones, dual-membrane MEMS silicon microphones have emerged to further improve some key performance characteristics, such as low noise and reliability. The dual membrane MEMS microphone may be implemented as a sealed (hermetically closed) dual-membrane microphone. A sealed dual-membrane MEMS microphone typically includes a top membrane, a bottom membrane, a perforated stator (acting as a fixed electrode similarly to the backplate in simple MEMS microphones), an isolation structure between peripheral portions of the top membrane and the stator and between the peripheral portions of the bottom membrane and the stator, and at least plurality of pillars coupled between the top membrane and the bottom membrane.

Further, sealed dual membrane microphones have a vacuum cavity formed between the top and bottom membrane and rely on a number of mechanical connection elements, such as pillars or columns, which are connecting (mechanically coupling) both membranes and preventing them from collapsing because of the pressure loads on both membranes. Because of the vacuum cavity, the pressure load on each membrane is obtained as the sum of the ambient pressure and the sound pressure. The ambient pressure component acting on the top membrane is balanced by the ambient pressure component acting on the bottom membrane via the mechanical connection elements (pillars). Thus, the mechanical connection elements are responsible for the mechanical stability of the MEMS microphone and, thus, for both the function and the long-term reliability of the MEMS microphone.

There is a need in the art to further increase the mechanical reliability of a dual- or multiple-membrane MEMS microphone without significantly affecting the resulting membrane's compliance so as to meet improved mechanical characteristics, such as improved long-term mechanical stability and sensitivity.

SUMMARY

Embodiments according to the present application are generally directed to a MEMS device. Some embodiments are concerned with sound (acoustic pressure) detecting structures used in portable electronic devices, e.g. smartphones, for acoustic pressure detection. Further embodiments relate to dual-membrane structures of acoustic detection devices (such as SDM MEMS microphones, SDM=sealed dual-membrane) having elliptical or oval-shaped mechanical connection elements (pillars or columns) between the movable membrane elements.

According to an embodiment, a MEMS device comprises a first deflectable membrane structure, a rigid electrode structure and a second deflectable membrane structure in a vertically spaced configuration, wherein the rigid electrode structure is arranged between the first and second deflectable membrane structures, wherein the first and second deflectable membrane structures each comprise a deflectable portion, and wherein the deflectable portions of the first and second deflectable membrane structures are mechanically coupled by mechanical connection elements to each other and are mechanically decoupled from the rigid electrode structure; and wherein at least a subset of the mechanical connection elements are elongated mechanical connection elements, wherein the elongated mechanical connection elements have a lateral cross-sectional area with a laterally elongated dimension along a direction (=elongation direction) which is within a tolerance range of +/−20° perpendicular to the local membrane deflection gradient of the first and second deflectable membrane structures at (or next to) the lateral position of the respective elongated mechanical connection element.

According to an embodiment, the elongated mechanical connection elements are arranged to have a lateral length (e.g., a laterally elongated dimension perpendicular to the local membrane deflection gradient) which is at least by a factor of 1.5 larger than a lateral width (in the direction of the local membrane deflection gradient) of the elongated mechanical connection elements in the local membrane deflection gradient direction.

According to an embodiment, the laterally elongated dimension of the elongated mechanical connection elements is aligned within a tolerance range of +/−20° in parallel with the edge line (border line) of the first and second deflectable membrane structures.

According to an embodiment, the elongated mechanical connection elements are arranged to have a (lateral) center-line between distal endpoints in the laterally elongated dimension (in the plane of the lateral cross section area), wherein the lateral centerline is within a tolerance range of +/−20° perpendicular to the local membrane deflection gradient of the first and second deflectable membrane structures.

The mechanical connection elements, e.g. in form of pillars or columns, are subject to high normal and shear forces when the differential pressure gets really high and heavily deflects the pillar-coupled membranes. This is especially true for mechanical connection elements close to the membrane edge. As a consequence, such mechanical connection elements must be designed properly in order to withstand the combined normal and shear forces present in severe test conditions way beyond normal microphone operating conditions.

Typical mechanical connection elements have a circular cross section with a certain small diameter and some length with determines the distance between both membranes. The structural stability of a sealed dual membrane microphone can be enhanced if the mechanical connection elements are designed with an elongated, e.g. oval or elliptical shape. In case of a circular membrane, for example, the direction of elongation is perpendicular to the line connecting the pillar's position with the center of a circular membrane.

A key technical effect of the proposed elongated implementation of the mechanical connection elements compared to a larger diameter of a standard circular mechanical connection element is the structural stability and robustness increase without a large impact on the overall compliance of the coupled membrane. Thus, the high sensitivity and the high SNR of the multi-membrane MEMS microphones can be maintained. Moreover, a higher microphone robustness can ease the system design, e.g. a customer's system design.

Thus, embodiments of the present MEMS device relate to the implementation of laterally elongated mechanical connection elements, e.g. oval or elliptical pillars, for a multiple membrane MEMS microphone, e.g. a sealed dual membrane MEMS microphone, wherein the mechanical robustness can be improved with a minimal impact on the sensitivity and signal to noise ratio of the MEMS microphone.

BRIEF DESCRIPTION OF THE DRAWINGS

In the following, embodiments of the present disclosure are described in more detail with respect to the figures, in which:

FIGS. 3a-3c show schematic plane views of typical orientations of the elongated mechanical connection element with respect to the deflectable portions of the membranes according to an embodiment, wherein FIGS. 3a-3b show circular membranes and FIG. 3c shows a rectangular (square) membrane with rounded corners.

In the following description, embodiments are discussed in further detail using the figures, wherein in the figures and the specification identical elements and elements having the same functionality and/or the same technical or physical effect are provided with the same reference numbers or are identified with the same name. Thus, the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following description, embodiments are discussed in detail, however, it should be appreciated that the embodiments provide many applicable concepts that can be embodied in a wide variety of semiconductor devices. The specific embodiments discussed are merely illustrative of specific ways to make and use the present concept, and do not limit the scope of the embodiments. In the following description of embodiments, the same or similar elements having the same function have associated therewith the same reference signs or the same name, and a description of such elements will not be repeated for every embodiment. Moreover, features of the different embodiments described hereinafter may be combined with each other, unless specifically noted otherwise.

In the description of the embodiments, terms and text passages placed in brackets are to be understood as further exemplarily explanations, configurations, additions and/or alternatives, It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

For facilitating the description of the different embodiments, some of the figures comprise a Cartesian coordinate system x, y, z, wherein the x-y-plane corresponds, i.e. is parallel, to a reference plane (=x-y-plane), e.g. a main surface region of a substrate, wherein the direction vertically up with respect to the reference plane (x-y-plane) corresponds to the "+z" direction, and wherein the direction vertically down with respect to the reference plane (x-y-plane) corresponds to the "−z" direction. In the following description, the term "lateral" means a direction parallel to the x- and/or y-direction or a direction parallel to (or in) the x-y-plane, wherein the term "vertical" means a direction parallel to the z-direction.

Figure 1A:
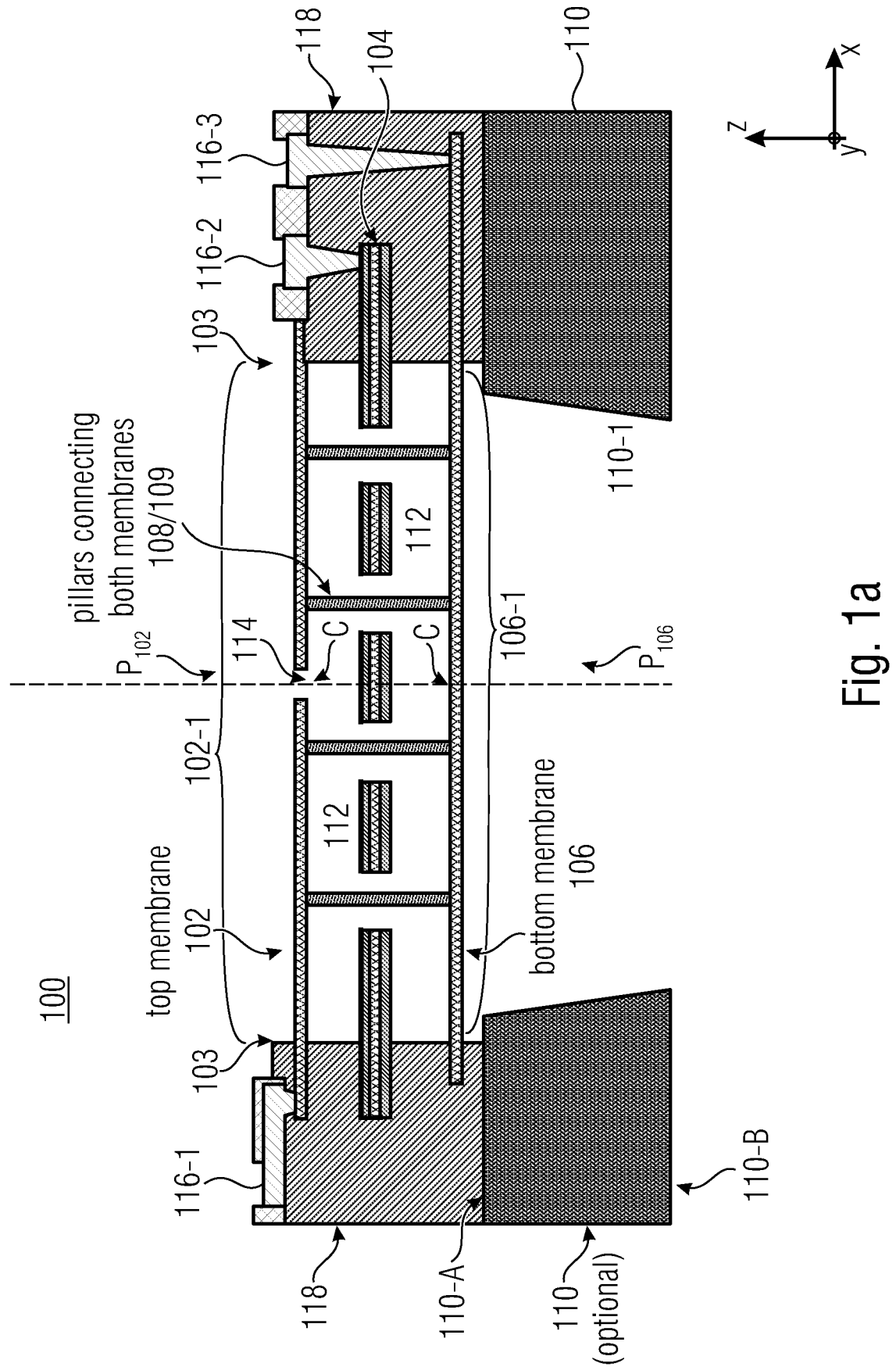
FIG. 1a shows a schematic cross-sectional view of a MEMS device in form of a dual membrane MEMS microphone according to various embodiments of the present disclosure.

FIG. 1a shows a schematic cross-sectional view of the MEMS device 100 in form of a dual membrane MEMS microphone according to various embodiments of the present disclosure.

As shown in FIG. 1a, the dual membrane MEMS microphone 100 comprises a first deflectable membrane structure 102, a rigid electrode structure 104 and a second deflectable membrane structure 106 in a vertically (=along the z-direction) spaced configuration. The rigid electrode structure 104 is arranged between the first and second deflectable membrane structures 102, 106, wherein the first and second deflectable membrane structures each comprise a deflectable portion 102-1, 106-1. The deflectable portions 102-1, 106-1 of the first and second deflectable membrane structures 102, 106 are mechanically coupled by means of mechanical connection elements (e.g., pillars or columns) 108, to each other and are mechanically decoupled from the rigid electrode structure 104. FIG. 1*a* further shows the membrane edge (border line) 103 and the centroid (center point) C of the deflectable portions 102-1, 106-1 of the first and second deflectable membrane structures 102 and 106, respectively.

The MEMS device 100 (dual membrane MEMS microphone) may comprise a substrate 110 having a through opening 110-1, e.g. a so-called Bosch cavity, between a first main surface region 110-A (e.g., a front side) and second main surface region 110-B (e.g., a back side) of the substrate 110.

The first deflectable (movable) membrane structure 102, the rigid electrode structure (also referred to as stator, backplate or counter-electrode) 104 and the second deflectable (movable) membrane structure 106 form a sound transducing portion of the MEMS device 100. The sound transducing portion of the MEMS device 100 may be arranged at the first main surface region 110-A of the substrate and may at least partially (or completely) span the through opening 110-1 in the substrate 110. The sound transducing portion senses the pressure difference between the front and back side thereof by means of a corresponding deflection of the mechanically coupled first and second deflectable membrane structures 102, 106 with respect to the rigid electrode structure 104. According to an embodiment, a cavity 112 between the first and second membrane structures 102, 106 may be open e.g. by means of a through-hole 114 or a plurality of through-holes 114, against the environment. Alternatively, the cavity 112 between the first and second membrane structures 102, 106 may be closed, with a closed through-hole 114, or even hermetically closed (sealed) against the environment, e.g. to provide a sealed dual membrane (SDM) MEMS micro-phone. The sealed configuration can provide an improved protection against dust and moisture ingress.

The terms "electrode" and "structure" are intended to illustrate that the membrane structure(s) 102, 106 and the rigid electrode structure 104 can respectively comprise a semiconductive or conductive layer or, also, a layer sequence or layer stack having a plurality of different layers, wherein at least one of the layers is electrically conductive, e.g., comprises a metallization layer and/or a conductive semiconductor (e.g., poly-silicon) layer.

The MEMS device 100 may further comprise electrical contact elements 116-1, 116-2, 116-3 for providing an electrical connection to further electric components or circuits, e.g. an ASIC (ASIC=application specific integrated circuit). An isolation structure 118 is provided between peripheral portions of the membrane structures 102, 106 and the rigid electrode structure 104. The isolation structure 118 is provided for fixing the peripheral portions of the membrane structures 102, 106 and the rigid electrode structure 104. The electrical contact elements 116-1, 116-2, 116-3 may be arranged in or at the isolation structure 118.

In the sealed dual membrane configuration, the first and second membrane structures 102, 104 are arranged in a hermetically sealed configuration, wherein the cavity 112 is formed therebetween. The sealed cavity 112 is formed as an encapsulation structure or vacuum chamber enclosing a low atmospheric pressure $P_{CAVITY}$, e.g. a low internal atmospheric pressure, such as a near vacuum condition. Thus, the sealed cavity 112 may comprise a reduced low atmospheric pressure (vacuum or near vacuum) of about or below 10 mbar, 8 mbar or 1 mbar. Upon a deflection of the first and second (mechanically coupled) membrane structures 102, 106, relative to the rigid electrode structure 104, that deflection or displacement can be capacitively readout in order to provide an output signal dependent on the deflection (gap change) with respect to the rigid electrode structure. The overall deflection of the mechanically coupled membrane structures 102, 106 is caused by a pressure difference $P_{102}$–$P_{106}$, which typically equals the acoustic sound pressure change in the environment.

The terms "rigid" and "deflectable" are intended to illustrate the relation between the high stiffness of the rigid electrode structure and the low stiffness (high compliance) of the deflectable membrane structure in a vertical deflection direction, wherein the stiffness of the "rigid" electrode structure 104 is at least 5×, 10× or 50× higher than the stiffness of the deflectable membrane structures 102, 106 in the vertical deflection direction.

(Sealed) dual or multiple MEMS microphones 100 with a (vacuum) cavity 112 rely on a number of mechanically connection elements, also referred to as pillars or columns, 108, which are connecting both membrane structures 102, 106 (in case of a dual membrane arrangement), and prevent the membrane structures 102, 106 from collapsing because of the pressure loads on both membrane structures 102, 106, i.e., the external pressure $P_{102}$ onto the top of the top membrane structure 102 and the external pressure $P_{106}$ onto the bottom of the bottom membrane structure 106. Such mechanical connection elements are subject to very high normal and shear forces when the differential pressure $(P_{102}$–$P_{106})$ gets high, which results in a strong and heavy deflection of the mechanically coupled (pillar-coupled) membrane structures 102, 106.

Figures 1B, 1C:
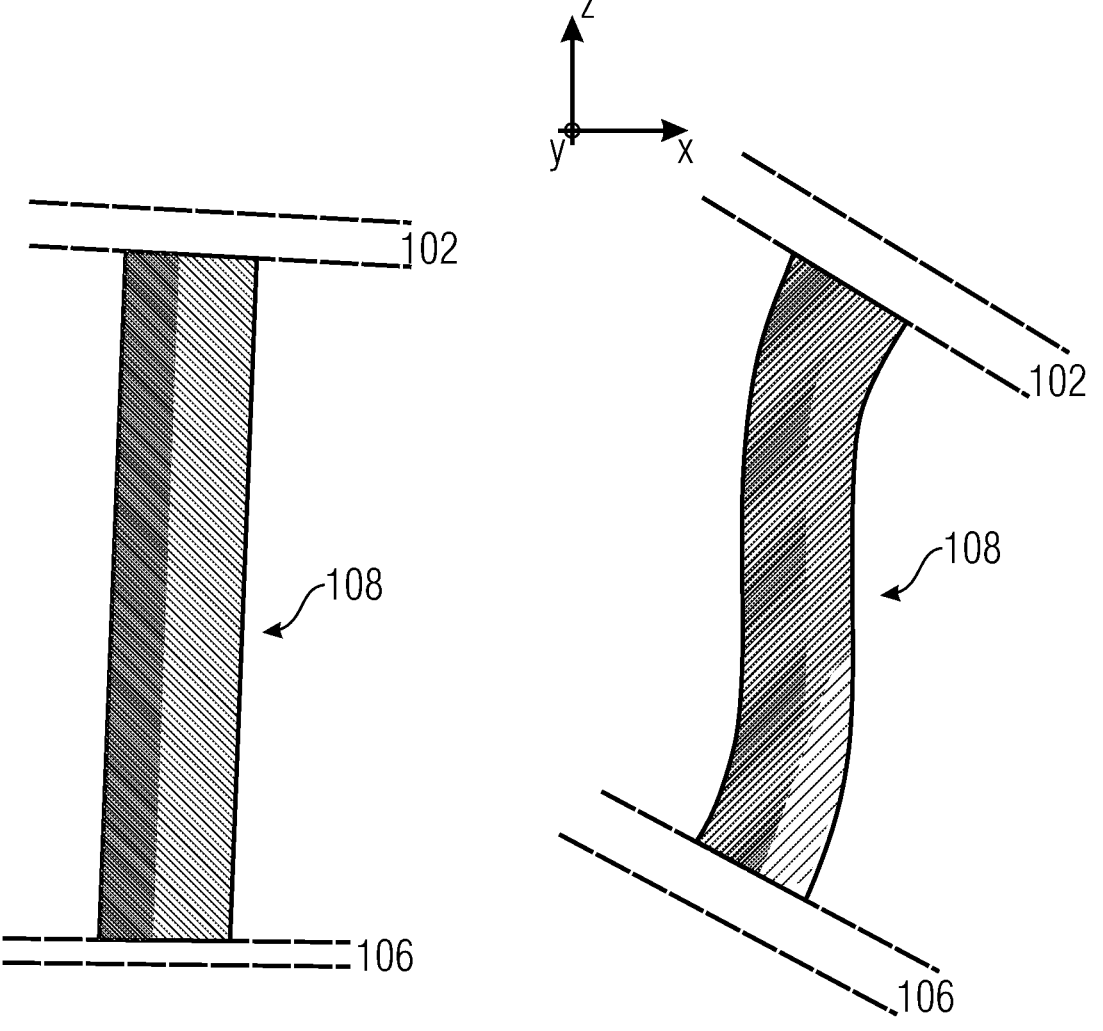
FIGS. 1b-1c show an enlarged and exaggerated side view of a single deformed circular mechanical connection element (pillar or column) in the center region and in the border region of the membranes of the dual membrane MEMS device of FIG. 1a in a deflected operation condition of the two membranes.

FIGS. 1*b*-1*c* respectively show an enlarged side view of a single deformed circular mechanical connection element (pillar or column) 108 in the center region (FIG. 1*b*) and the edge region (FIG. 1*c*, exaggerated view) of the deflected membranes 102, 106 of the dual membrane MEMS device 100 of FIG. 1*a*. Thus, FIGS. 1*b*-1*c* show that the standard mechanical connection elements 108 located near to the edge region of the membrane structures 102, 106 may deform and bend and may even be damaged under the combined normal and shear forces present under heavy differential pressure loadings (significantly exceeding standard operation conditions), which may be simulated in a test operation of the MEMS microphone 100.

Figure 2A:
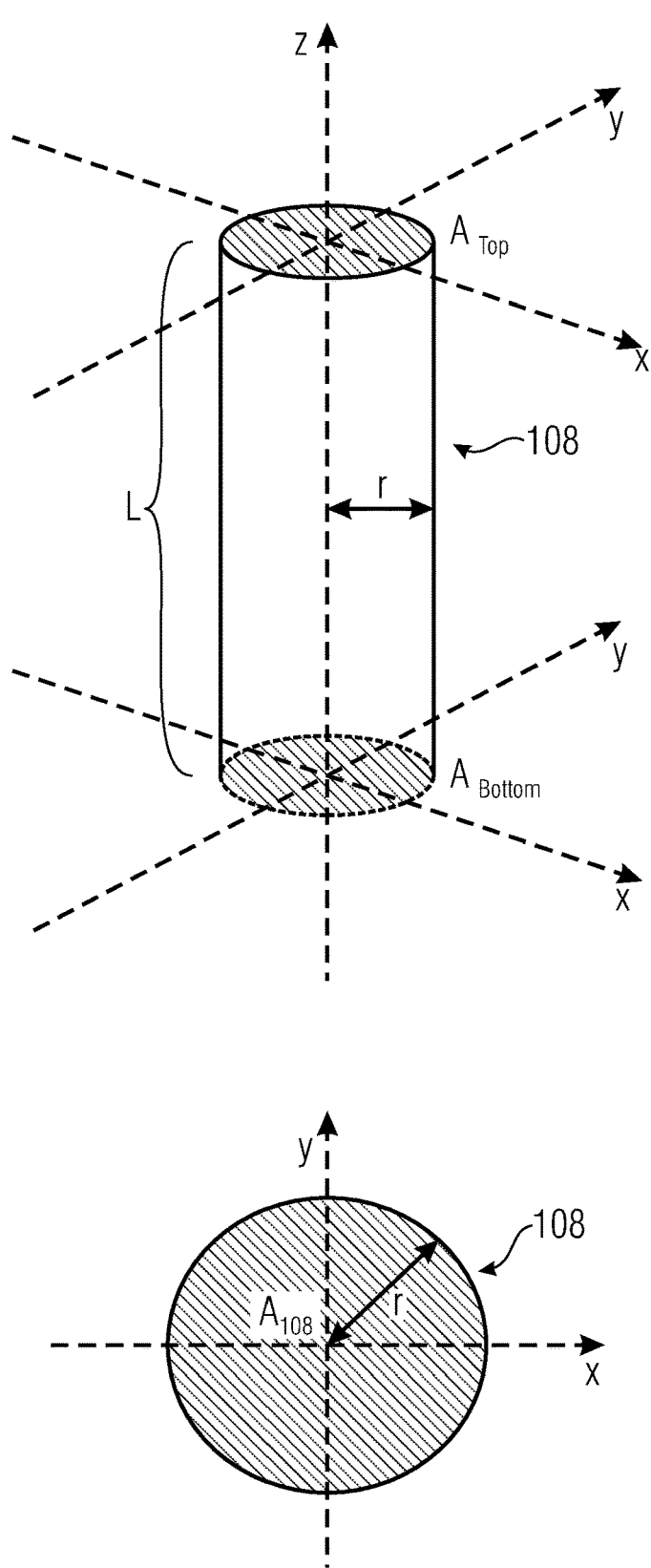
FIG. 2a shows a schematic 3-D view and a (x-y plane) cross-sectional view of a standard circular mechanical connection element.

FIG. 2*a* shows a schematic 3-D view and a (x-y plane) cross-sectional view of a standard circular mechanical connection element (pillar or column) 108. Such a standard mechanical connection element (=thin pillar with circular cross-section) 108 have the following dimensions:

L=(vertical) length=distance between coupled membranes 102, 106 (pillar oriented in z-direction)

r=radius (with the diameter: $d_{108}$=2 r)

$A_{108}$=$\pi$ $r^2$ (cross-section area in (x,y) plane)

$A_{Top}$ is the interface area between the pillar 108 at the top membrane 102, and $A_{Bottom}$ the interface area between the pillar 108 at the bottom membrane 106.

Thus, typical mechanical connection elements 108 have a circular cross section with a certain small diameter $d_{108}$ (with $d_{108}$=0.8 to 0.9 μm, for example) and a length L which determines the distance D (with D=5 μm, for example) between both membrane structures 102, 106.

Figure 2B:
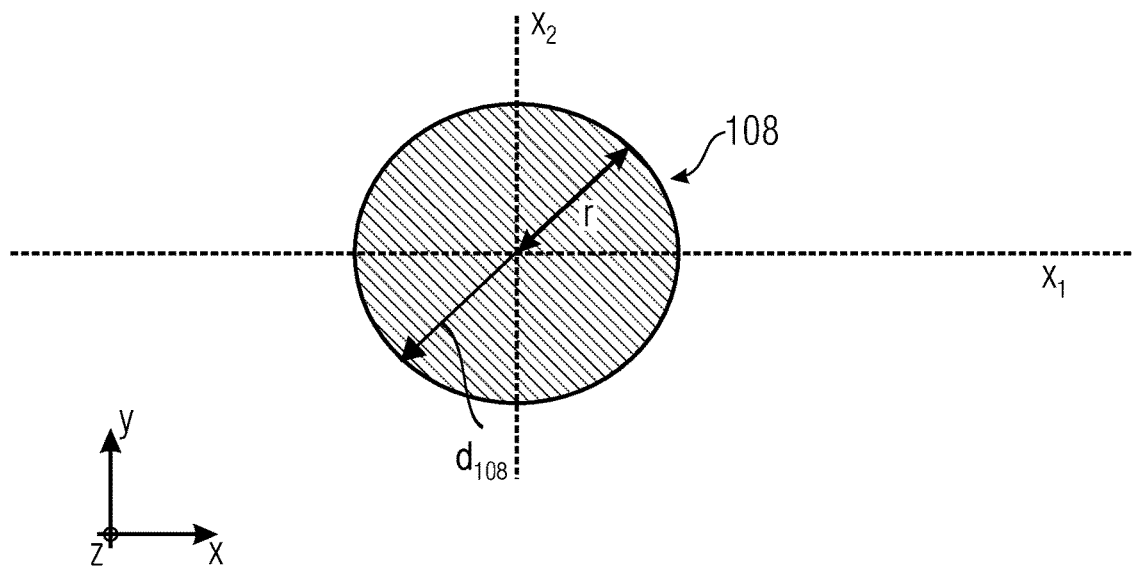
FIG. 2b shows a schematic (x-y plane) cross-sectional view together with the principal axes of the circular mechanical connection element in comparison to an elongated mechanical connection element of the MEMS device according to an embodiment.
Figure 2B:
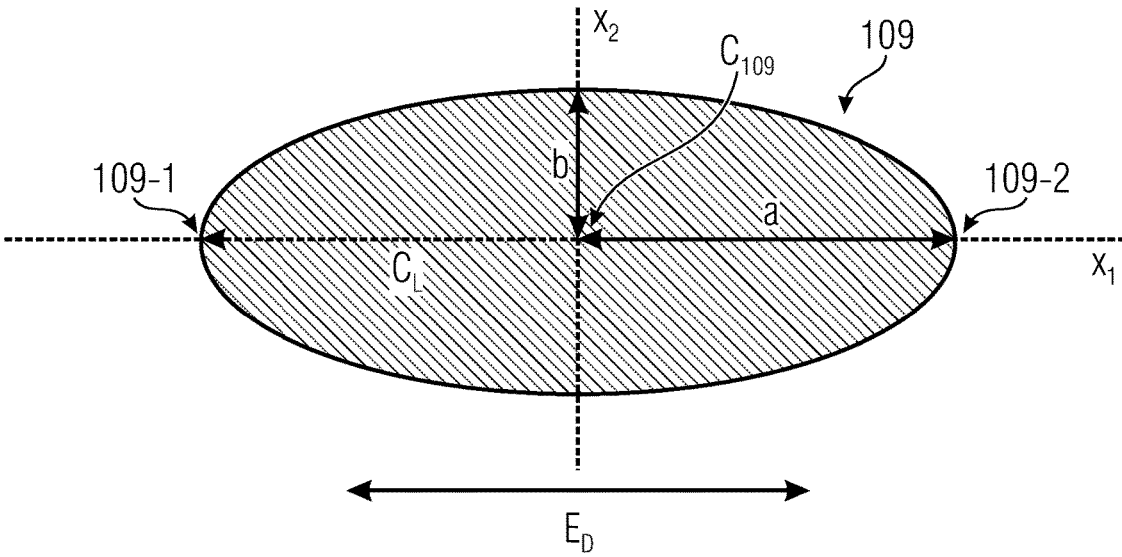

FIG. 2*b* shows a schematic (x-y plane) cross-sectional view together with the principal axes of a standard circular mechanical connection element 108 in comparison to an elongated mechanical connection element 109 of the MEMS device 100 according to an embodiment.

As shown in FIG. 2b, the standard pillar 108 comprises a circular lateral cross section with a diameter $d_{108}$, wherein the elongated mechanical connection element 109 according to embodiments comprises, for example, an elliptical cross-section with a laterally elongated dimension "a" (=major half axis corresponding to a pillar length 2a) and a further lateral dimension "b" (=minor half axis with a corresponding to a pillar width 2b). The elongated mechanical connection elements 109 are elongated in a lateral direction (=elongation direction ED parallel to the x-y-plane) and pillar- or column-shaped in a vertical direction (parallel to the z-direction).

In the following, the principal axes and principal moments of circular pillars 108 and elongated pillars 109 are summarized:

$x_1$, $x_2$=principal axes of pillar cross section (through the centroid);

$x_1$ and $x_2$ are perpendicular, i.e. $x_1 \perp x_2$ $I_1$, $I_2$=principal moments of inertia $D_1$, $D_2$=flexural rigidities or pillar (with respect to principal axes)

$D_1$=E $I_1$ and $D_2$=E $I_2$, with E=Young's modulus

For circular pillars 108 the cross section area is $A_{108}=\pi r^2$ and the principal moments of inertia are $I_1=I_2=(\pi/4) r^4$.

For elliptic pillars 109 the cross section area is $A_{109}=\pi$ a b and the principal moments of inertia are $I_1=(\pi/4)$ a $b^3$ and $I_2=(\pi/4)$ $a^3$ b with $I_1<I_2$ for a>b, where a is the major half axis and b is the minor half axis.

In the following, it is also referred to the schematic cross-sectional view of the MEMS device 100 in form of a dual membrane MEMS microphone as shown in FIG. 1a, wherein the specifically formed, elongated mechanical connection elements 109 (e.g., with an elliptic or oval-shaped cross-section, etc.) according to the embodiments of the present disclosure are indicated with the reference number log.

According to an embodiment, the MEMS device 100, e.g., in form of a dual membrane MEMS microphone, comprises the first deflectable membrane structure 102, the rigid electrode structure 104 and the second deflectable membrane structure 106 in a vertically spaced configuration. The rigid electrode structure 104 is arranged between the first and second deflectable membrane structures 102, 106, wherein the first and second deflectable membrane structures each comprise the deflectable portion 102-1, 106-1. The deflectable portions 102-1, 106-1 of the first and second deflectable membrane structures 102, 106 are mechanically coupled by means of mechanical connection elements 108, 109, e.g. in form of pillars or columns, to each other and are mechanically decoupled from the rigid electrode structure 104.

The following discussion of the specific form of the elongated mechanical connection elements 109 of a dual-membrane MEMS microphone 100 is equally applicable to a multiple-membrane MEMS microphone 100 having three or more membrane structures, wherein neighboring membrane structures are mechanically coupled by means of "elongated" mechanical connection elements 109.

Figures 2C, 2D:
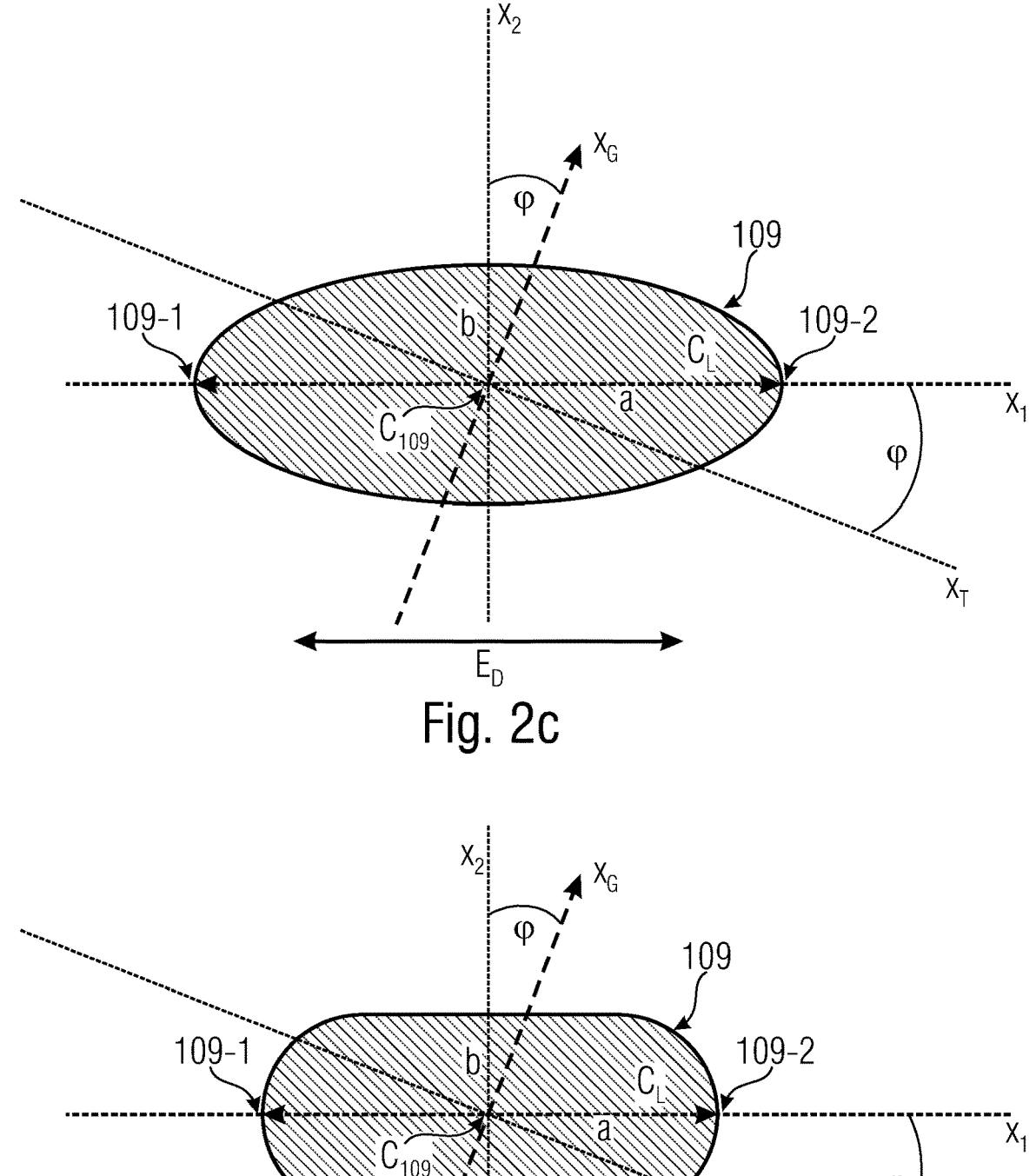
FIG. 2c shows a typical alignment of an elliptic elongated mechanical connection element with respect to the local membrane deflection gradient of the first and second deflectable membranes at the lateral position of the elongated mechanical connection element according to an embodiment.
FIG. 2d shows a typical alignment of an oval-shaped elongated mechanical connection element with respect to the local membrane deflection gradient of the first and second deflectable membranes at the lateral position of the elongated mechanical connection element according to an embodiment.

FIG. 2c shows a typical alignment of an elongated mechanical connection element 109 (having an elliptic cross-section) with respect to the direction of the local membrane deflection gradient G of the first and second deflectable membranes 102, 106 at the lateral position of the elongated mechanical connection element 109 according to an embodiment.

FIG. 2d shows a typical alignment of an elongated mechanical connection element 109 having an oval-shaped cross-section with respect to the direction of the local membrane deflection gradient G of the first and second deflectable membranes 102, 106 at the lateral position of the elongated mechanical connection element 109 according to an embodiment.

Figure 3A:
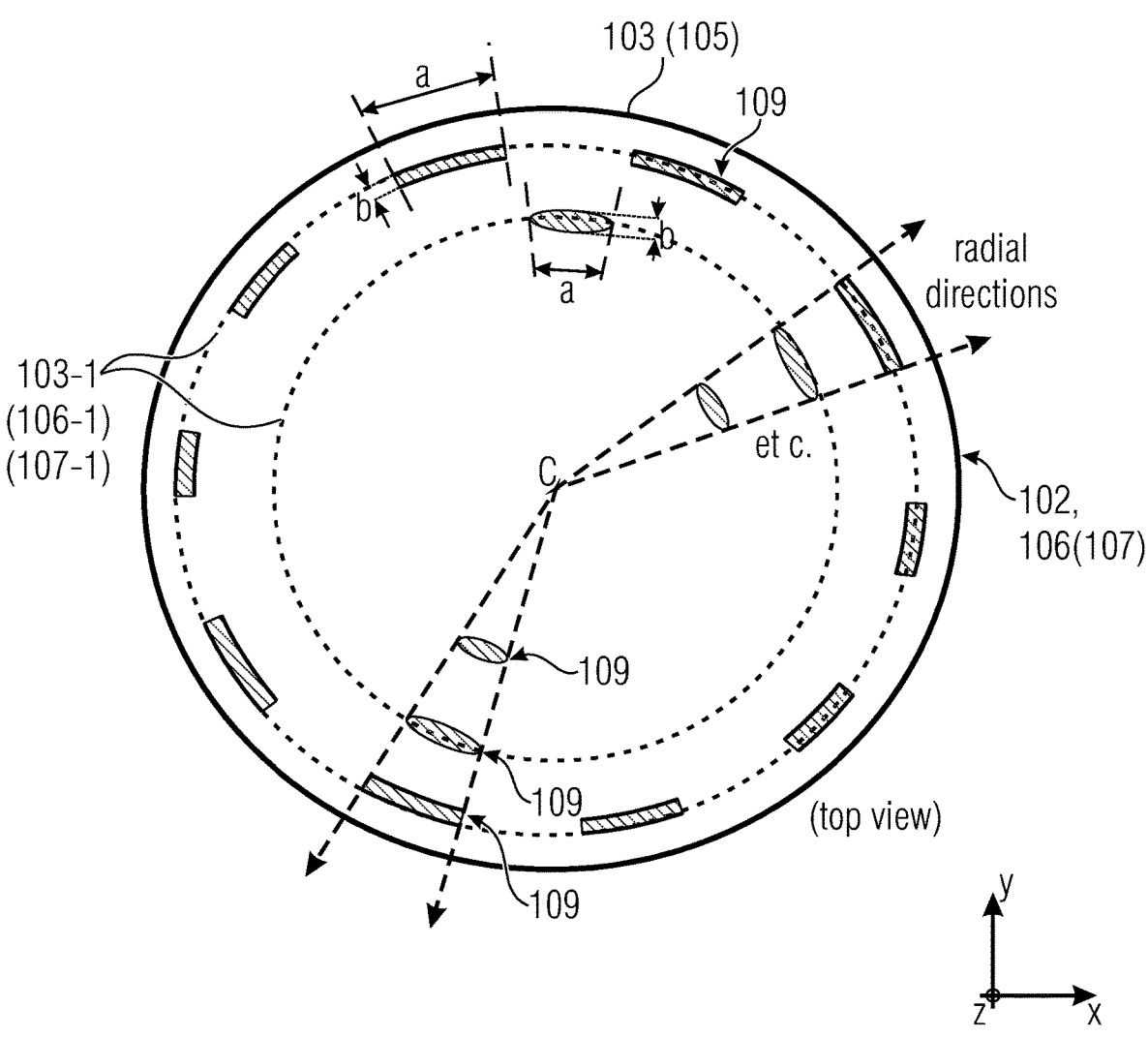

FIG. 3a shows a top view of a circular dual membrane with some examples for pillar positions, cross section shapes, sizes and orientations. Pillars 109 are elongated and oriented with respect to membrane deflection contour lines 103-1 along their respective positions.

Figure 3B:
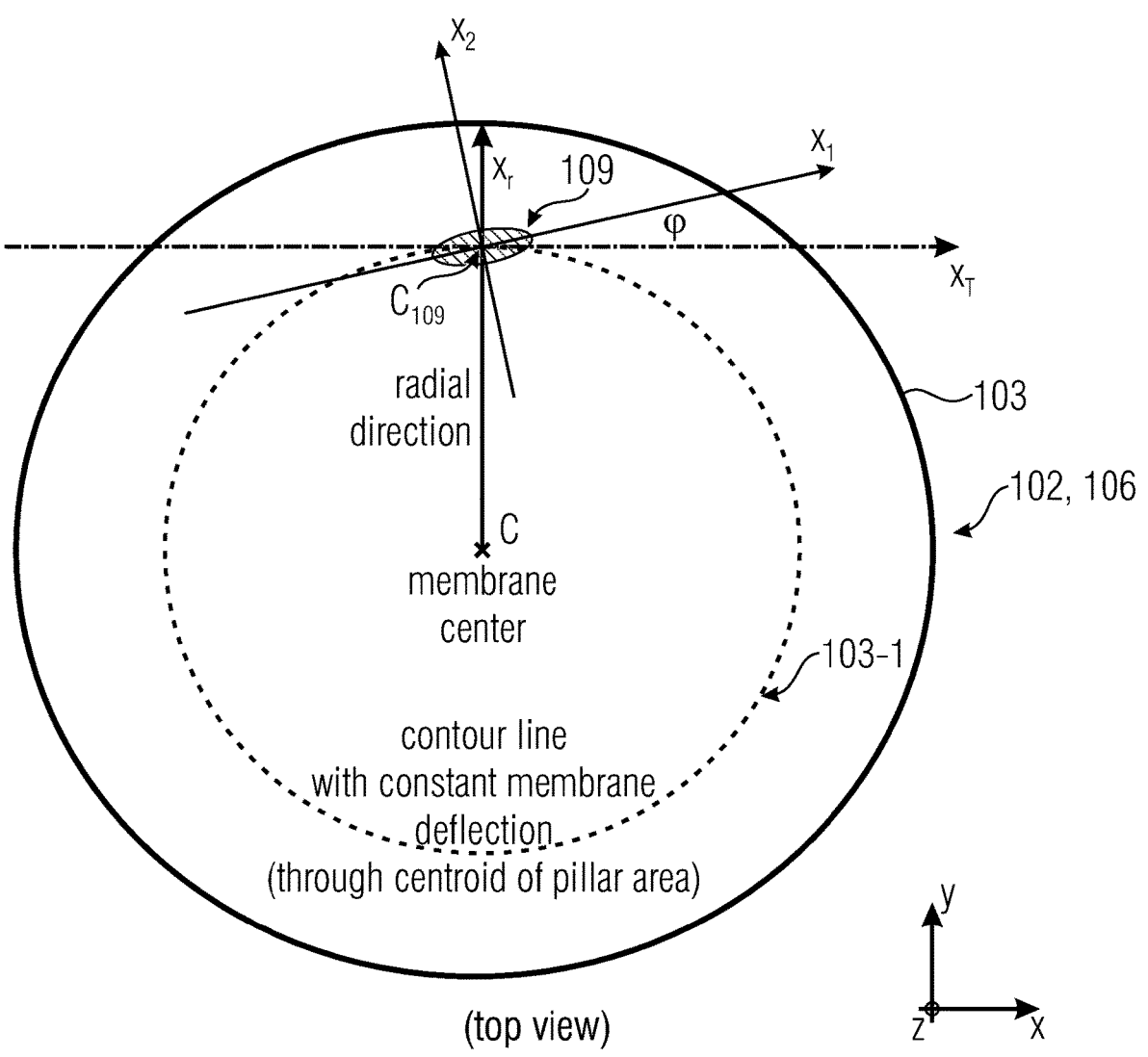

FIG. 3b shows for example details about the orientation of an individual pillar with respect to the membrane deflection contour line through its centroid. In this example, the pillar has an elliptic cross section with half axes along x1 and x2, where x1 is the direction of elongation. The axes x1 and x2 are the principal axes of the pillar cross section, and can be defined for any shape of an elongated pillar.

Figure 3C:
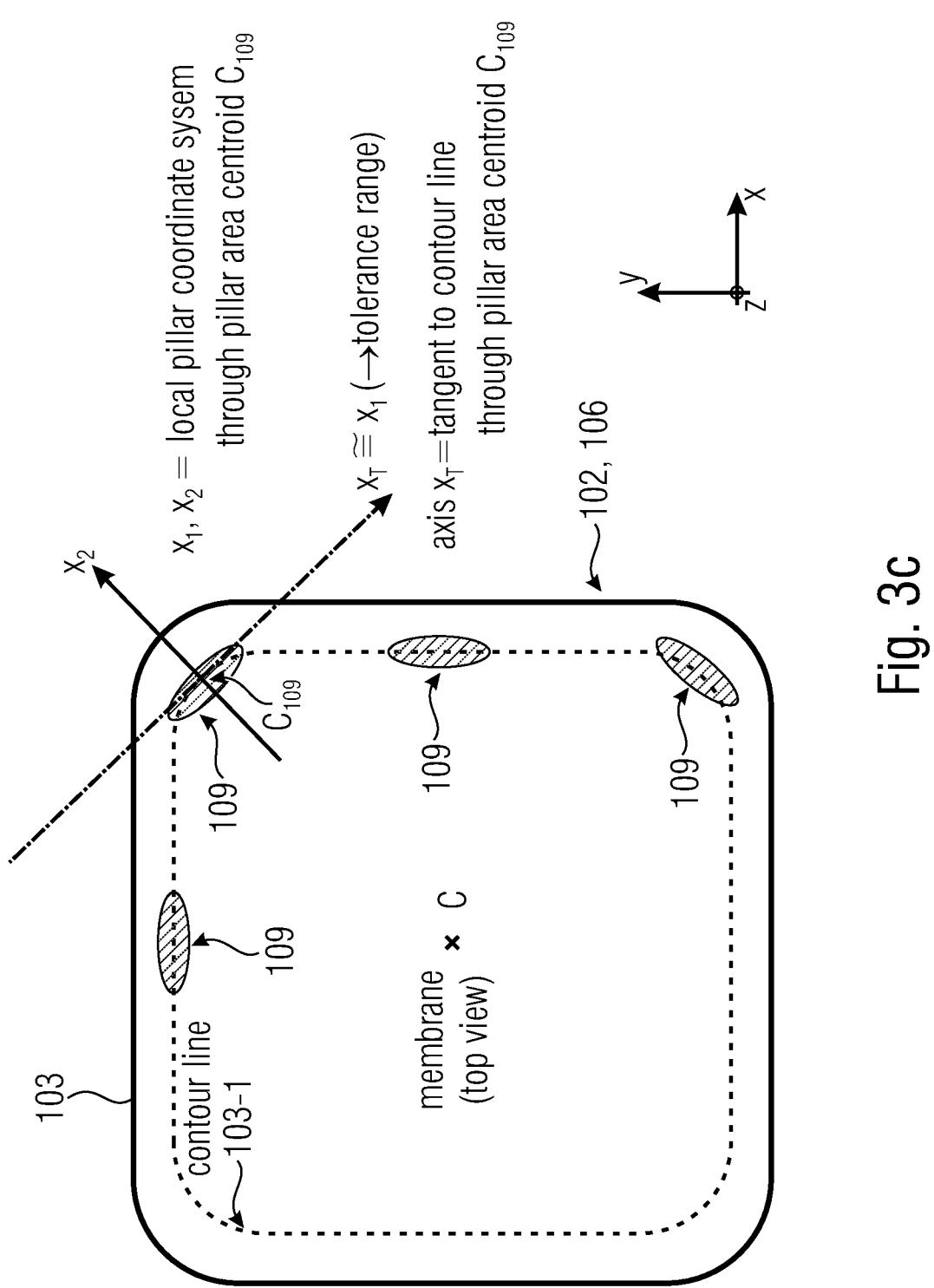

FIG. 3c shows a similar example for a rectangular (square) membrane. The membrane deflection contour lines are no longer circles but have a more or less rounded rectangular (square) shape.

In the following, the alignment of the elongated pillars 109 depending on the pillar position and on the pillar orientation on the membrane structure 102, 106 is summarized:

$x_1$=principal axis with $I_1<I_2$ (i.e. with the smaller principal moment typically along the elongated dimension);

$x_2$=principal axis with $I_2>I_1$(i.e. with the larger principal moment);

$x_G$=direction of the membrane deflection gradient G at the pillar position (in x-y-plane); and $x_T$=tangent to the contour line 103-1 of membrane deflection at the pillar position (in x-y-plane, perpendicular to $x_G$).

The angle $\varphi=\angle(x_1, x_T)=\angle(x_2, x_G)$ depends on the pillar position P on the membrane 102, 106 and on the pillar orientation with respect to the local contour line 103-1 of the membrane deflection. This angle should be small for every pillar (ideally zero), corresponding to a pillar orientation $x_1$ along the contour line 103-1 of the membrane deflection.

In the MEMS device 100, at least a subset of the mechanical connection elements 108, 109 is formed by elongated mechanical connection elements 10, wherein the elongated mechanical connection elements 109 have a lateral cross-sectional area with a laterally elongated dimension "a" along a direction $E_D$ (=elongation direction) which is within a tolerance range of +/−20° or +/−10° (see for example the angle $\varphi=\angle(x_1, x_T)=\angle(x_2, x_G)$ in FIGS. 2c-2d) perpendicular to the direction $x_G$ of the local membrane deflection gradient "G" of the first and second deflectable membranes at or next to the lateral position of the respective elongated mechanical connection element 10. Thus, the tolerance range of +/−20° or +/−10° perpendicular to the direction $x_G$ of the local membrane deflection gradient G of the first and second deflectable membranes 102, 106 is exemplarily shown as angle φ in FIGS. 2c-2d. According to a further embodiment, the (deviation) angle φ may be between 0° and 20° or between 0° and 10° or between 0° and 4°. According to a further embodiment, the (deviation) angle φ may be between 0° and −20° or between 0° and −10° or between 0° and −4°. According to a further embodiment, the angle φ is 0°, for example.

According to a further embodiment, the angle φ is 0°, for example. Thus, the elongated pillars 109 may be oriented in such a way that their respective principal axis $x_1$ (with the smaller principal moment of inertia $I_1$) is oriented along the tangent $x_T$ of the membrane deflection contour line 103-1 at the pillar's position. Or equivalently, the elongated pillars 109 are oriented in such a way that their respective principal axis $x_2$ (with the larger principal moment of inertia $I_2$) is oriented along the gradient $x_G$ of the membrane deflection at the pillar's position.

The elongated mechanical connection elements 109 may comprise a lateral cross-section area with the lateral (pillar) length "$2a$" along the elongation direction $E_D$ and (essentially) parallel to the membrane edge (border line) 103 or contour line 103-1 of membrane deflection, wherein the lateral (pillar) length "$2a$" is larger than the lateral (pillar) width "$2b$", wherein the lateral (pillar) width "$2b$" may extend along the gradient G of the membrane deflection and may point towards the membrane edge 103. The lateral length "$2a$" is perpendicular to the lateral width "$2b$" (and both are in a plane parallel to the x-y-plane). As shown in FIGS. 2b-2d, the principal axes x1 and x2 (which are always perpendicular to each other) are oriented along the pillar length "$2a$" and pillar width "$2b$", respectively. This can be assumed if the pillar cross section is (essentially) symmetrical with respect to the principal axes through the centroid.

At any membrane position, the tangent to the contour line 103-1 of membrane deflection is always perpendicular to the local gradient of the membrane deflection. In the case of circular membrane structures 102, 106 with a circular membrane edge 103 and an axisymmetric membrane deflection, the gradient direction $x_G$ is equal to the radial direction, and the contour lines 103-1 are circles around the membrane center C and thus precisely parallel to the membrane edge (at or next to the lateral position of the respective elongated mechanical connection element 109—see also e.g., FIG. 3b). However, the contour lines 103-1 do not always precisely follow the membrane edge 103, see e.g. the corners of a rectangular membrane (see also e.g., FIG. 3c).

Thus, the principal axes $x_1$ and $x_2$ of a pillar's cross section are always perpendicular, and the tangent $x_T$ to the contour line 103-1 of the membrane deflection is always perpendicular to the gradient $x_G$ of the membrane deflection (both taken at the respective pillar position).

According to an embodiment as shown in FIGS. 2b-2d, the elongated mechanical connection elements 109 are arranged to have a lateral length "$2a$" (=laterally elongated dimension) perpendicular to the local membrane deflection gradient which is at least by a factor of 1.5 larger than a lateral width "$2b$" (in the direction of the local membrane deflection gradient) of the elongated mechanical connection elements 109 in the direction $x_G$ local membrane deflection gradient G.

According to an embodiment, the ratio between the lateral length "$2a$" and the lateral width "$2b$" of the elongated mechanical connection elements may be between 1.5 and 3.0.

According to an embodiment, the laterally elongated dimension "a" of the elongated mechanical connection elements 109 is aligned within a tolerance range of +/−20° or +/−10° in parallel with the edge line (=border line) 103 or the contour line 103-1 of the first and second deflectable membrane structures 102, 106. According to an embodiment, the laterally elongated dimension "a" of the elongated mechanical connection elements 109 is aligned in parallel with the edge line 103 or the contour line 103-1 of the first and second deflectable membrane structures 102, 106.

According to an embodiment, the elongated mechanical connection elements 109 are arranged to have a (lateral) centerline "$C_L$" between distal endpoints 109-1, 109-2 in the laterally elongated dimension "a" along the elongation direction $E_D$ (in the plane of the lateral cross section area), wherein the lateral centerline $C_L$ is within a tolerance range of +/−20° (or +/−10°) perpendicular to the local membrane deflection gradient G of the first and second deflectable membrane structures.

According to an embodiment, the lateral centerline $C_L$ is perpendicular to the local membrane deflection gradient G of the first and second deflectable membrane structures 102, 106 and the angle φ is 0°.

According to an embodiment, the elongated mechanical connection elements 109 are arranged in a border region of the first and second deflectable membrane structures 102, 106 and, in particular, within a lateral distance to the borderline 103 of a first third of the radius from the borderline 103 to a center point C of the deflectable membrane structures 102, 106. In other words, the elongated mechanical connection elements 109 are essentially positioned near the borderline 103 but not near the center C.

According to an embodiment, the lateral length "$2a$" of the elongated mechanical connection elements 109 is in a range between 1.2 and 3 μm or between 1.5 and 2 μm, and wherein the lateral width "$2b$" of the elongated mechanical connection elements 109 is between 0.5 to 1.0 μm or between 0.6 to 0.9 μm.

According to an embodiment, a further subset of the mechanical connection elements 108 has a lateral cross-sectional area with a circular shape.

According to an embodiment, the proportion (ratio) of the elongated mechanical connection elements 109 with respect to the circular mechanical connection elements 108 increases in a radial direction R with a decreasing distance to the borderline 103 of the first and second deflectable membrane structures 102, 106.

According to an embodiment, all mechanical connection elements are elongated, i.e. =are formed as elongated mechanical connection elements log.

According to an embodiment, the first and second deflectable membrane structures 102, 106 may form a cavity 112 against the environment, wherein the cavity 112 between the first and second deflectable membrane structures 102, 106 is closed against the environment. Thus, the closed cavity 112 may contain some gas, e.g. at a lower pressure than outside the cavity 112.

According to an embodiment, the MEMS device 100 may be formed as a multiple-membrane MEMS microphone having three or more membrane structures, wherein neighboring membrane structures are mechanically coupled by means of the "elongated" mechanical connection elements 109. Thus, the MEMS device may comprise at least a further deflectable membrane structure 107, wherein the two outermost deflectable membrane structures form a cavity 112 against the environment, wherein the cavity 112 between the two outermost deflectable membrane structures is closed against the environment.

According to an embodiment, the elongated mechanical connection elements 109 comprise a pillar-shape or column-shape between two opposing deflectable membrane elements 102, 106.

FIGS. 2c-2d show a typical orientation of the elongated mechanical connection element 109 with respect to the direction $x_G$ of the local membrane deflection gradient G of the first and second deflectable membranes 102, 106 at the lateral position P of the respective elongated mechanical connection element 109.

According to an embodiment, an (deviation) angle φ (=angle φ in FIGS. 2c-2d) between a principal axis $x_1$ of the elongated mechanical connection elements 109 along the laterally elongated dimension "a" along the elongation direction $E_D$ and a tangent $X_T$ to a contour line 103-1 of the deflectable membrane element 109 through the centroid $C_{109}$ of the lateral cross-sectional area is smaller than +/−20° or +/−10°. According to an embodiment, the (deviation) angle φ may be between 0° and 20° or between 0° and 10° or =between 0° and 4° According to a further embodiment, the (deviation) angle φ may be between 0° and −20° or between 0° and −100° or =between 0° and −4°. According to a further embodiment, the angle φ is 0°, for example.

According to an embodiment, the principal area moment $I_1$ of inertia of the elongated mechanical connection elements 109 along the laterally elongated dimension "a" is at least by a factor of 1.5 smaller than the principal area moment $I_2$ of inertia of the elongated mechanical connection elements 109 along the lateral direction "b" perpendicular to the laterally elongated dimension. The lateral direction "b" perpendicular to the laterally elongated dimension "a" is ideally equal to the direction of the local membrane deflection gradient G at the lateral position P of the respective elongated mechanical connection element 109.

According to an embodiment, the MEMS device 100 is a MEMS sound transducer with a microphone or loudspeaker functionality, for example.

In the following, some physical considerations about oval-shaped pillars 109 and a precise definition of their orientation with respect to the shape of a deflected membrane 102, 106 are exemplarily presented and summarized. The indicated dimensions are only exemplary values and may vary with different realizations of MEMS microphones 100.

Mechanically Connected Membranes 102, 106: The coupled membrane structures 102, 106 are realized by mechanically coupling two (or more) membranes 102, 106 by means of a number of small pillars 108, 109 (mechanical connection elements). The pillars 108, 109 are quite uniformly distributed over the entire membrane area. The pillars 108, 109 are small enough to only have a minimal effect on the compliance of the coupled membrane(s) 102, 106, and their number is large enough to carry the pressure load $P_{102}$, $P_{106}$ put on the top and/or bottom membrane of the coupled membrane(s) 102, 106.

Some Typical Dimensions of a SDM MEMS Microphone inn: In case of a so-called Sealed Dual Membrane (SDM) MEMS microphone structure with an evacuated cavity between both membranes, pillar size and pillar number should be chosen large enough to counterbalance the ambient pressure load on both membranes plus extra pressure loads according to application needs and/or robustness test conditions. For an SDM microphone with membrane diameter around 1 mm, a typical number of pillars is of order 1000 with a typical pillar diameter in the order of 1 μm. The vertical distance between individual membranes of the coupled membrane stack is typically several μm. In case of SDM microphones, the vertical membrane separation (distance) determined by the pillar length L is typically 5 μm.

Orientation of the Elongated Mechanical Connection: If a pillar is oriented with its principal axis $x_1$ (with $I_1 < I_2$) along the contour line of the coupled membrane deflection, one has $I_T = I_1$ with respect to an axis $x_T$ along the contour line (=the tangent to the contour line). The contour line with points (xc,yc) through a pillar at location (xp, yp) is defined by $\zeta(xc, yc) = \zeta(xp, yp)$ where $\zeta(x,y)$ denotes the membrane deflection in z direction at a point/x,y). The tangent along the contour line through the pillar's centroid is perpendicular to the gradient grad $\zeta(xp, yp)$.

A deflected membrane leads to a bending of the pillars, depending on their respective location on the membrane. As a consequence, the pillars are subject to bending moments and shear forces. Both bending moments and shear forces are proportional to the pillar's flexural rigidity Dc and proportional to the membrane slope φ at the pillar location. Overall, the effect of the pillars on the coupled membrane compliance depends on the number of pillars, their locations, and their flexural rigidities. The pillar flexural rigidities D1 and D2 (of every type of pillar if pillars of different size and shape are used) should be kept as small as possible in order to maximize the coupled membrane compliance. However, a lower limit to the smallest flexural rigidity, i.e. D1 in our notation, is given by Euler's buckling criterion in order to ensure that the critical load of every pillar is larger than the expected maximum load during device operation or under test conditions.

Elongated Mechanical Connections: Larger Cross-Section Areas and Reduced Stress: With respect to the anchor areas of the pillars, e.g. the connections between the pillars and the top and the bottom membrane, the shear stress is inversely proportional to the cross section area A of the pillar. Pillar anchor robustness and membrane compliance can therefore be optimized by minimizing $I_T$ of all pillars (above the buckling criterion, of course) while maximizing the cross section area A.

Pillars with elongated cross sections, like for example elliptic or oval-shape cross-sections, offer an advantage over pillars with circular cross-sections, provided that the elongated pillars are properly aligned with respect to membrane deflections.

The structural stability of the (sealed) dual membrane MEMS microphone 100 can be enhanced by means of the elongated mechanical connection elements 109 due to their design with an elongated shape, e.g. an oval or elliptical shape, wherein the lateral length "2a" of the mechanical connection element 109 is perpendicular to the local membrane deflection gradient G. In case of circular membrane structures 102, 106, the lateral length "2a" of the mechanical connection element 109 is perpendicular to the radial direction, wherein the radial direction extends along the connection line between the respective pillar 109 and the membrane center point "C".

The main effect of the elongated mechanical connection elements 109, e.g. at border regions of the membrane structures 102, 106, compared to a larger pillar diameter of a standard circular pillar 108 gives the structural stability increase without a large impact on the overall compliance of the coupled membrane structures 102, 106.

FIGS. 3a-3c show schematic plane views of typical orientations of the elongated mechanical connection element 109 with respect to the deflectable portions 102-1, 106-1 of the membranes structures 102, 106, wherein FIGS. 3a-3b show circular membranes structures 102, 106 and FIG. 3c shows a rectangular (square) membrane structure 102, 106 with rounded corners. With respect to FIGS. 3a-3c, it is pointed out that the drawings are only schematic views and not to scale.

FIG. 3a shows a top view of the circular membrane structure 102, 106. The mechanical connection elements 109 (pillars) are formed as "circular segments" (ring segments) which are elongated parallel to the membrane edge 103. The long pillar dimension "2a" (=length) is (e.g., within a tolerance range) parallel to the membrane edge 103 and, for example, follows the contour lines 103-1 of the membrane deflection. The short pillar dimension "2b" (width) is oriented perpendicular to the contour line(s) 103-1-, e.g. in the radial direction for circular membranes 102, 106. The mechanical connection elements 109 which are placed at smaller radii (=distance from the membrane center C) can be of same width "2b" but of smaller length "2a". As exemplarily shown in FIG. 3a, oval- or elliptical-shaped pillars 109 or similarly shaped pillars 109 may be used instead of the circular segmented pillars, e.g. in case the pillars 109 are small enough.

According to an embodiment, the MEMS device 100 may be formed as a multiple-membrane MEMS microphone having three or more membrane structures, wherein neighboring membrane structures are mechanically coupled by means of the "elongated" mechanical connection elements 109. Thus, the MEMS device may comprise at least a further deflectable membrane structure 107, wherein the two outermost deflectable membrane structures form a cavity 112 against the environment, wherein the cavity 112 between the two outermost deflectable membrane structures is closed against the environment.

In case, the MEMS device 100 is formed as a multiple-membrane MEMS microphone having three membrane structures 102, 106, 107, the MEMS device 100 comprises a first rigid electrode structure 103, a second rigid electrode structure 105, a first deflectable membrane structure 102, a second deflectable membrane structure 106 and a third deflectable membrane structure 107 in a vertically spaced configuration, e.g. in vertically separated and spaced configuration. The first rigid electrode structure 103 is sandwiched between the first and second deflectable membrane structure 102, 106, wherein the second rigid electrode structure 105 is sandwiched between the second and third deflectable membrane structure 106, 107. The first, second and third deflectable membrane structures 102, 106, 107 each comprises a deflectable portion 102-1, 106-1, 107-1, wherein the deflectable portions 102-1, 106-1, 107-1 of the first, second and third deflectable membrane elements 102, 106, 107 are mechanically coupled to each other by means of the mechanical connection elements log, and are mechanically decoupled from the first and second rigid electrode structures 103, 105.

This setting of the MEMS device 100 can be also applied to a multiple-membrane MEMS microphone having four or more membrane structures.

As shown in FIG. 3b, the mechanical connection elements 109 may be formed as pillars 109 with an elliptic cross-section (parallel to the x-y-plane). The local coordinate system with axes $x_1$ and $x_2$ extend through the centroid $C_{109}$ of the cross-sectional area of the pillars 109. The axes $x_1$ and $x_2$ are the principal axes of the pillar cross-section. The corresponding principal moment of inertia are $I_1$, $I_2$, respectively. The notation (i.e., numbering with indices 1 and 2) of principal axes and principal moments is such that $I_1 < I_2$.

Thus, the corresponding principal moments of inertia are $I_1$ and $I_2$ with $I_1 < I_2$. The axis $x_T$ is the tangent to the contour line 103-1 through the pillars centroid $C_{109}$. The contour line through the position (xp, yp) of the pillar is defined by all membrane points with the same deflection (for a given pressure situation). For a circular membrane structure 102, 106 with axisymmetric deflection, the contour lines 103-1 are also circles. The angle φ (tolerance range) extends between the axes $x_1$ and $x_T$.

In this connection, it is pointed out that these definitions do not necessarily assume an elliptic shape of the pillar cross-section, but apply to any shape. Elliptic or oval-like shapes of the lateral cross-section of the pillars 109 may form embodiments of the disclosure.

To be more specific, the (deviation) angle φ (see also FIG. 2b) between a principal axis $x_1$ of the elongated mechanical connection elements 109 along the laterally elongated dimension "a" along the elongation direction $E_D$ and a tangent $X_T$ to a contour line 103-1 of the deflectable membrane element 109 through the centroid $C_{109}$ of the lateral cross-sectional area is smaller than +/−20° or +/−10°. According to an embodiment, the angle φ is 0°, for example.

With an angle φ=0°, the principal axis $x_1$ of the mechanical connection elements 109 along the laterally elongated dimension "a" along the elongation direction $E_D$ coincides with the tangent $x_T$ to the contour line 103-1 of the deflectable membrane element 102, 106 through the centroid $C_{109}$ of the lateral cross-sectional area of the respective mechanical connection element 109. In other words, with angle φ=0°, the principal axis $x_1$ of a mechanical connection element 109 along the laterally elongated dimension "a" along the elongation direction $E_D$ is perpendicular to the local membrane deflection gradient G at the lateral position P of the respective elongated mechanical connection element 109.

Moreover, the principal moment of inertia $I_1$ of the elongated mechanical connection elements 109 along the laterally elongated dimension "a" is at least by a factor of 1.5 smaller than the principal moment of inertia $I_2$ of the elongated mechanical connection elements 109 along the lateral direction "b" perpendicular to the laterally elongated dimension. The lateral direction "b" perpendicular to the laterally elongated dimension "a" is equal to the direction of the local membrane deflection gradient G at the lateral position P of the respective elongated mechanical connection element 109.

FIG. 3c shows a rectangular (square) membrane structure 102, 106 with rounded corners. As shown in FIG. 3c, the pillars 109 with elliptical cross-sections may be oriented with the long side (principal axis $x_1$) along the contour lines of the membrane deflection. The above evaluations with respect to FIG. 3b, are equally applicable to the membrane structure 102, 106 and pillars 109 of FIG. 3c.

Additional embodiments and aspects are described which may be used alone or in combination with the features and functionalities described herein.

According to an embodiment, a MEMS device comprises a first deflectable membrane structure, a rigid electrode structure and a second deflectable membrane structure in a vertically spaced configuration, wherein the rigid electrode structure is arranged between the first and second deflectable membrane structures, wherein the first and second deflectable membrane structures each comprise a deflectable portion, and wherein the deflectable portions of the first and second deflectable membrane structures are mechanically coupled by means of mechanical connection elements to each other and are mechanically decoupled from the rigid electrode structure; and wherein at least a subset of the mechanical connection elements are elongated mechanical connection elements, wherein the elongated mechanical connection elements have a lateral cross-sectional area with a laterally elongated dimension along a direction which is within a tolerance range of +/−20° perpendicular to the local membrane deflection gradient of the first and second deflectable membrane structures at the lateral position of the respective elongated mechanical connection element.

According to an embodiment, the elongated mechanical connection elements are arranged to have a lateral length perpendicular to the local membrane deflection gradient which is at least by a factor of 1.5 larger than a lateral width of the elongated mechanical connection elements in the local membrane deflection gradient direction.

According to an embodiment, the ratio between the lateral length and the lateral width of the elongated mechanical connection elements is between 1.5 and 3.0.

According to an embodiment, the laterally elongated dimension of the elongated mechanical connection elements is aligned within a tolerance range of +/−20° in parallel with the edge line (border) of the first and second deflectable membrane structures.

According to an embodiment, the elongated mechanical connection elements are arranged to have a centerline between distal endpoints in the laterally elongated dimension, wherein the lateral centerline is within a tolerance range of +/−20° perpendicular to the local membrane deflection gradient of the first and second deflectable membrane structures.

According to an embodiment, the lateral cross-sectional area of the elongated mechanical connection elements comprises an oval shape, elliptic shape or ring-segment shape.

According to an embodiment, the elongated mechanical connection elements are arranged in a border region of the first and second deflectable membrane structures and, in particular, within a lateral distance to the borderline of a first third of the radius from the borderline to a center point of the deflectable membrane structures.

According to an embodiment, wherein the lateral length of the elongated mechanical connection elements is in a range between 1.2 and 3 $\mu$m or between 1.5 and 2 $\mu$m, and wherein the lateral width of the elongated mechanical connection elements is between 0.5 to 1.0 $\mu$m or between 0.6 to 0.9 $\mu$m.

According to an embodiment, a further subset of the mechanical connection elements has a lateral cross-sectional area with a circular shape.

According to an embodiment, the proportion of the elongated mechanical connection elements with respect to the circular mechanical connection elements increases in a radial direction with a decreasing distance to the borderline of the first and second deflectable membrane structures.

According to an embodiment, all mechanical connection elements are elongated.

According to an embodiment, the first and second deflectable membrane structures form a cavity against the environment, wherein the cavity between the first and second deflectable membrane structures is closed against the environment.

According to an embodiment, the MEMS device further comprises at least a further deflectable membrane structure, wherein the two outermost deflectable membrane structures form a cavity against the environment, wherein the cavity between the two outermost deflectable membrane structures is closed against the environment.

According to an embodiment, the mechanical connection elements comprise a pillar-shape or column-shape between two opposing deflectable membrane elements.

According to an embodiment, an angle $\varphi$ between a principal axis $x_1$ of the mechanical connection elements along the laterally elongated dimension and a tangent $x_T$ to a contour line of the deflectable membrane element through the centroid of the lateral cross-sectional area is smaller than +/−20°.

According to an embodiment, the principal area moment $I_1$ of inertia of the elongated mechanical connection elements along the laterally elongated dimension is at least by a factor of 1.5 smaller than the principal area moment $I_2$ of inertia of the elongated mechanical connection elements along the lateral direction perpendicular to the laterally elongated dimension.

According to an embodiment, the MEMS device is a MEMS sound transducer with a microphone or loudspeaker functionality.

Additional embodiments and aspects are described which may be used alone or in combination with the features and functionalities described herein.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

Depending on certain implementation requirements, embodiments of the control circuitry can be implemented in hardware or in software or at least partially in hardware or at least partially in software. Generally, embodiments of the control circuitry can be implemented as a computer program product with a program code, the program code being operative for performing one of the methods when the computer program product runs on a computer. The program code may for example be stored on a machine readable carrier.

In the foregoing detailed description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus, the following claims are hereby incorporated into the detailed description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. A microelectromechanical systems (MEMS) device comprising:

a first deflectable membrane structure, a rigid electrode structure and a second deflectable membrane structure in a vertically spaced configuration, wherein the rigid electrode structure is arranged between the first and second deflectable membrane structures, wherein the first and second deflectable membrane structures each comprise a deflectable portion, and wherein the deflectable portions of the first and second deflectable membrane structures are mechanically coupled by mechanical connection elements to each other and are mechanically decoupled from the rigid electrode structure; and wherein at least a subset of the mechanical connection elements are elongated mechanical connection elements, wherein the elongated mechanical connection elements have a lateral cross-sectional area with a laterally elongated dimension along a direction which is within a tolerance range of +/−20° perpendicular to a local membrane deflection gradient of the first and second deflectable membrane structures at a lateral position of the respective elongated mechanical connection element.

2. The MEMS device of claim 1, wherein the elongated mechanical connection elements are arranged to have a lateral length perpendicular to the local membrane deflection gradient which is at least a factor of 1.5 larger than a lateral width of the elongated mechanical connection elements in the local membrane deflection gradient direction.

3. The MEMS device of claim 2, wherein a ratio between the lateral length and the lateral width of the elongated mechanical connection elements is between 1.5 and 3.0.

4. The MEMS device of claim 2, wherein the lateral length of the elongated mechanical connection elements is in a range between 1.2 µm and 3 µm or between 1.5 µm and 2 µm, and wherein the lateral width of the elongated mechanical connection elements is between 0.5 µm and 1.0 µm or between 0.6 µm and 0.9 µm.

5. The MEMS device of claim 1, wherein the laterally elongated dimension of the elongated mechanical connection elements is aligned within a tolerance range of +/−20° in parallel with an edge line of the first and second deflectable membrane structures.

6. The MEMS device of claim 1, wherein the elongated mechanical connection elements are arranged to have a centerline between distal endpoints in the laterally elongated dimension, wherein the lateral centerline is within a tolerance range of +/−20° perpendicular to the local membrane deflection gradient of the first and second deflectable membrane structures.

7. The MEMS device of claim 1, wherein the lateral cross-sectional area of the elongated mechanical connection elements comprises an oval shape, elliptic shape, or ring-segment shape.

8. The MEMS device of claim 1, wherein the elongated mechanical connection elements are arranged in a border region of the first and second deflectable membrane structures and within a lateral distance to a borderline of a first third of a radius from the borderline to a center point of the deflectable membrane structures.

9. The MEMS device of claim 1, wherein the first and second deflectable membrane structures form a cavity against an environment, wherein the cavity between the first and second deflectable membrane structures is closed against the environment.

10. The MEMS device of claim 1, further comprising:

at least one third deflectable membrane structure, wherein two outermost deflectable membrane structures among the first deflectable membrane structure, the second deflectable membrane structure, and the at least one third deflectable membrane structure form a cavity against an environment, wherein the cavity between the two outermost deflectable membrane structures is closed against the environment.

11. The MEMS device of claim 1, wherein the elongated mechanical connection elements comprise a pillar-shape or column-shape between the first and second deflectable membrane structures.

12. The MEMS device of claim 1, wherein an angle between a principal axis of the mechanical connection elements along the laterally elongated dimension and a tangent to a contour line of at least one of the first or second deflectable membrane structures through a centroid of the lateral cross-sectional area is smaller than +/−20°.

13. The MEMS device of claim 1, wherein a principal area moment of inertia of the elongated mechanical connection elements along the laterally elongated dimension is at least a factor of 1.5 smaller than a principal area moment of inertia of the elongated mechanical connection elements along the lateral direction perpendicular to the laterally elongated dimension.

14. A microelectromechanical systems (MEMS) device, comprising:

a first deflectable membrane structure having a deflectable portion;

a second deflectable membrane structure having a deflectable portion; and a rigid electrode structure disposed between the first and second deflectable membrane structures; and mechanical connection elements that mechanically couple the deflectable portions of the first and second deflectable membrane structures to each other, wherein the deflectable portions of the first and second deflectable membrane structures are mechanically decoupled from the rigid electrode structure, wherein at least a subset of the mechanical connection elements are elongated mechanical connection elements, wherein the elongated mechanical connection elements have a lateral cross-sectional area with a laterally elongated dimension along a direction which is within a tolerance range of +/−20° perpendicular to a local membrane deflection gradient of the first and second deflectable membrane structures at a lateral position of the respective elongated mechanical connection element, and wherein the MEMS device is a MEMS sound transducer with a microphone or loudspeaker functionality.

15. The MEMS device of claim 14, wherein the elongated mechanical connection elements are arranged to have a lateral length perpendicular to the local membrane deflection gradient which is at least a factor of 1.5 larger than a lateral width of the elongated mechanical connection elements in the local membrane deflection gradient direction.

16. The MEMS device of claim 15, wherein a ratio between the lateral length and the lateral width of the elongated mechanical connection elements is between 1.5 and 3.0.

17. The MEMS device of claim 14, wherein the laterally elongated dimension of the elongated mechanical connection elements is aligned within a tolerance range of +/−20° in parallel with an edge line of the first and second deflectable membrane structures.

18. A microelectromechanical systems (MEMS) device comprising:

a first deflectable membrane structure having a deflectable portion;

a second deflectable membrane structure having a deflectable portion; and a rigid electrode structure disposed between the first and second deflectable membrane structures; and mechanical connection elements that mechanically couple the deflectable portions of the first and second deflectable membrane structures to each other, wherein the deflectable portions of the first and second deflectable membrane structures are mechanically decoupled from the rigid electrode structure, wherein a first subset of the mechanical connection elements are elongated mechanical connection elements, wherein the elongated mechanical connection elements have a lateral cross-sectional area with a laterally elongated dimension along a direction which is within a tolerance range of +/−20° perpendicular to a local membrane deflection gradient of the first and second deflectable membrane structures at a lateral position of the respective elongated mechanical connection element, and wherein a second subset of the mechanical connection elements are circular mechanical connection elements having a lateral cross-sectional area with a circular shape.

19. The MEMS device of claim 18, wherein a proportion of the elongated mechanical connection elements with respect to the circular mechanical connection elements increases in a radial direction with a decreasing distance to a borderline of the first and second deflectable membrane structures.

* * * * *